us009590694B2

(12) United States Patent
Lumpkin

(10) Patent No.: US 9,590,694 B2
(45) Date of Patent: Mar. 7, 2017

(54) CONFIGURABLE AUDIO TRANSMITTER CIRCUITRY

(71) Applicant: Polycom, Inc., San Jose, CA (US)

(72) Inventor: Jarrod M. Lumpkin, Marietta, GA (US)

(73) Assignee: Polycom, Inc., San Jose, CA (US)

( * ) Notice: Subject to any disclaimer, the term of this patent is extended or adjusted under 35 U.S.C. 154(b) by 649 days.

(21) Appl. No.: 13/682,012

(22) Filed: Nov. 20, 2012

(65) Prior Publication Data

US 2014/0140542 A1 May 22, 2014

(51) Int. Cl.
*H03F 99/00* (2009.01)
*H04B 3/02* (2006.01)
*H03F 3/217* (2006.01)

(52) U.S. Cl.
CPC ............... *H04B 3/02* (2013.01); *H03F 3/217* (2013.01)

(58) Field of Classification Search
CPC .. H04B 3/02; H03F 1/34; H03F 3/217; H04R 27/00; H04R 3/00; H04R 3/002
USPC ....... 381/121, 120, 123, 122, 95, 94.6, 94.1; 330/75, 116, 291, 252, 149
See application file for complete search history.

(56) References Cited

U.S. PATENT DOCUMENTS

| 4,979,218 | A | * | 12/1990 | Strahm | ......................... 381/94.6 |
| 6,316,970 | B1 | | 11/2001 | Hebert | |
| 2010/0054494 | A1 | * | 3/2010 | Chen | ......................... H04R 3/00 381/92 |
| 2010/0164539 | A1 | * | 7/2010 | Balamurugan et al. | ........ 326/30 |

OTHER PUBLICATIONS

SSM2142 Balanced Line Driver Data Sheet, Analog Devices (2011).
That 1606, 1646 Data Sheet, That Corporation (2011).

* cited by examiner

*Primary Examiner* — Vivian Chin
*Assistant Examiner* — Con P Tran
(74) *Attorney, Agent, or Firm* — Blank Rome, LLP

(57) ABSTRACT

Audio transmitter circuitry is disclosed that is configurable into different modes by the user, and can output either a differential or single-ended audio signal on two signal wires. Depending on the mode, the transmitter deals with noise on the signal wires by adjusting the input resistance that such noise sees looking into the transmitter. If the transmitter is configured in a differential mode, the input resistance looking back into the transmitter from the perspective of the noise on both signal wires is relatively high. If the transmitter is configured in a single ended mode, the input resistance of noise looking back from the active signal wire into the transmitter is relatively low, to in effect ground such noise back into the transmitter, without significantly presenting such noise to the receiver.

27 Claims, 13 Drawing Sheets

| Mode | Figures | S1 | S2 | S3 | S4 | S5 | S6 | Ri_X | gain |
|---|---|---|---|---|---|---|---|---|---|
| Differential XMIT / Differential RCV | 3A-3B | open | open | open | closed | open | open | high | 2 |
| Differential XMIT / Single-Ended RCV | 4A-4B | open | open | open | closed | either closed; other open | | high | 2 |
| Single-Ended XMIT / Single-Ended RCV | 5A-5B | closed | open | closed | open | closed | open | low | 2 |
| Single-Ended XMIT / Single-Ended RCV | 6A-6B | closed | closed | open | open | closed | open | low | 1 |

*Figure 2B*

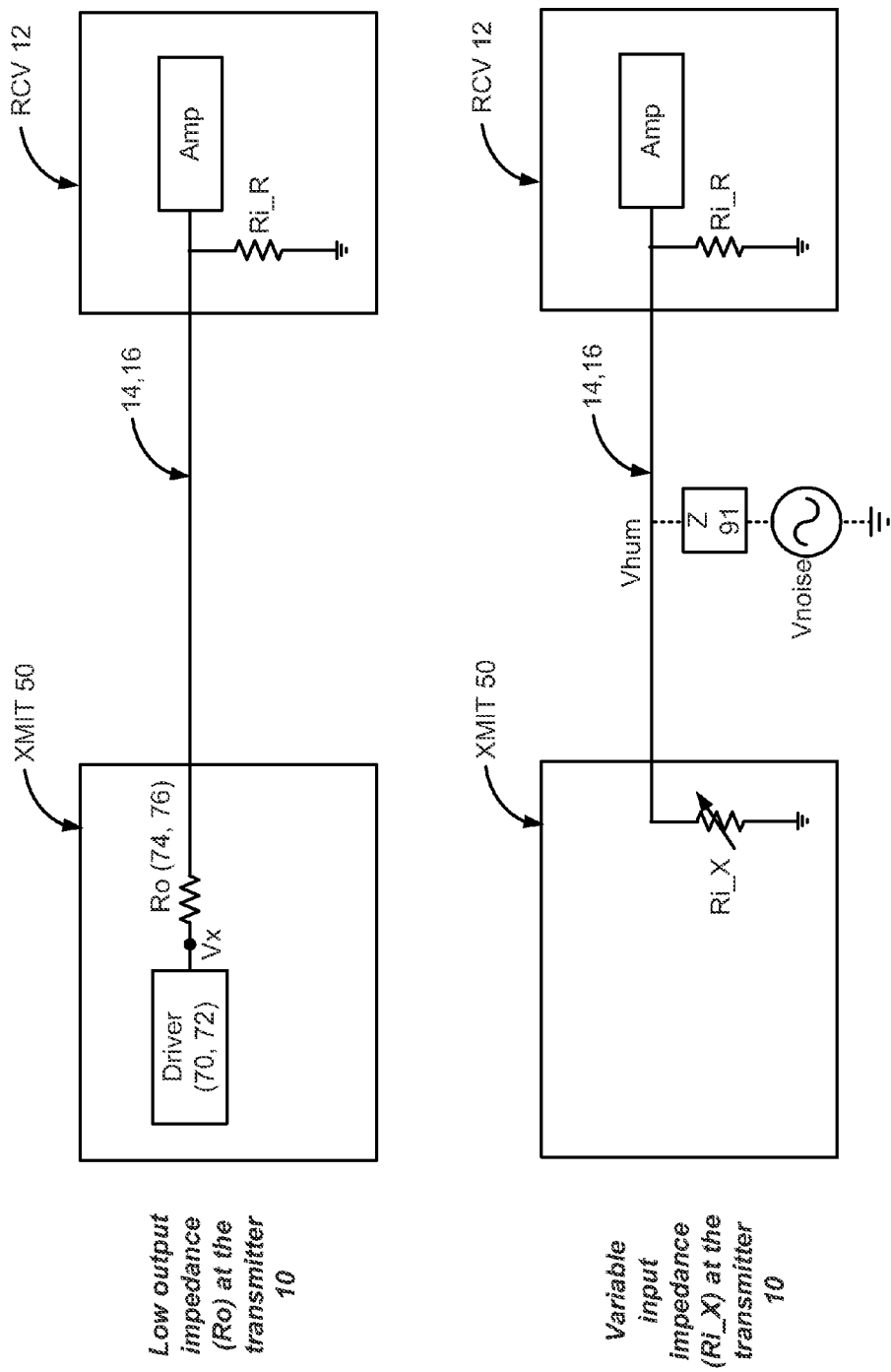

CONFIGURABLE AUDIO TRANSMITTER CIRCUITRY

FIELD OF THE INVENTION

The present invention relates to improved audio transmitter circuitry which is configurable to send an audio signal to a receiver in either a differential or single ended manner, while providing for noise compensation.

BACKGROUND

There are many applications where it is desired to send an audio signal over a relatively long distance. For example, in an auditorium-type audio system, it may be useful to send an audio signal from a source device, such as a microphone, to a far-away output device, such as a speaker, which may be more than 100 feet away from the microphone.

FIG. 1 shows a prior art system 5 that can be used in such an application. As shown, an audio signal is sent from a source device 8 to a transmitter 10. If the amplitude of the audio signal is too low to be suitable for transmission, it can optionally be amplified by an amplifier in the transmitter 10 as shown. Ultimately, the transmitter 10 processes (e.g., filters, amplifies, etc.) the audio signal and drives the audio signal onto a pair of signal wires 14 and 16 that carry the audio signal to a receiver 12. As alluded to above, the signal wires 14 and 16 can be relatively long. Typically, the signal wires 14 and 16 are incorporated into a single cable having a shield (not shown), which shield is typically connected to the chassis ground of the transmitter 10.

Although not shown, the transmitter 10 can comprise many inputs connectable to different sources 8, and can comprise many paired outputs to transmit audio signals to a number of different receivers 12. Moreover, the transmitter 10 may be connected to and controlled by, or incorporated with, a computer 11. Computer 11 allows a user to route the audio signal onto a suitable signal wire pair 14/16 destined for an appropriate receiver 12, and otherwise allows a user to control the processing at the transmitter 10 via software operating on computer 11. Computer 11 may be connected to the receiver 12 as well, or the receiver can be connected to its own control computer, or to no computer at all. Use of no computer at the receiver 12 is common, as appropriate control and processing of the audio signal can occur on the front end at the transmitter 10.

Once received at the receiver 12, the received audio signal can again be processed (again, filtered and amplified), and ultimately output to an output device 18, such as a speaker, where it can be heard. One skilled in the art will understand that the receiver 12 and output device 18 may often be incorporated into a single device or cabinet.

A reality of the use of long signal wires 14 and 16 is increased susceptibility to noise, particularly electromagnetic interference, which may come from many different sources, such as adjacent power lines and other nearby electrical devices. Such noise can cause AC voltage perturbations on one or both of the signal wires 14 and 16 depending on the configuration of the system 5. Noise is obviously not desired because, if not mitigated somehow, it could be received and amplified at the receiver 12, and possibly ultimately heard at the output device 18.

The inventor has seen the need for improved transmitter circuitry that is flexible and configurable to work in different modes depending on the circumstances in which it is used, such as whether the receiver 12 comprises a differential or single-ended device, as will be explained herein. Additionally, the inventor notes that the handling of noise at an improved transmitter should also change depending on these circumstances. An embodiment of such improved transmitter circuitry, and how it operates, is disclosed herein.

DETAILED DESCRIPTION

Improved audio transmitter circuitry is disclosed. The transmitter is configurable into different modes by the user, and can output either a differential audio signal on two signal wires, or a single-ended signal on the two signal wires, where one wire carries the signal and the other is grounded. The mode chosen by the user may depend on the method by which the transmitter transmits (e.g., differential or single ended), or by which the transmitted signal(s) will be received (again differential or single-ended).

Depending on the mode chosen by the user, the transmitter is configured to appropriately deal with noise on one or more of the signal wires by adjusting the input resistance that such noise sees looking into the transmitter. If the transmitter is configured in a differential mode, the input resistance looking back into the transmitter from the perspective of the noise on both signal wires is controlled to be relatively high, which is beneficial because the differential receiver would likely be able to cancel such noise. If by contrast the transmitter is configured in a single ended mode, in which a single ended receiver would be unable to subtract out the effect of noise from a signal-ended channel, the input resistance of noise looking back from the active signal wire into the transmitter is controlled to be relatively low, to attempt to ground such noise back into the transmitter, without significantly presenting such noise to the receiver.

Figure 2A:
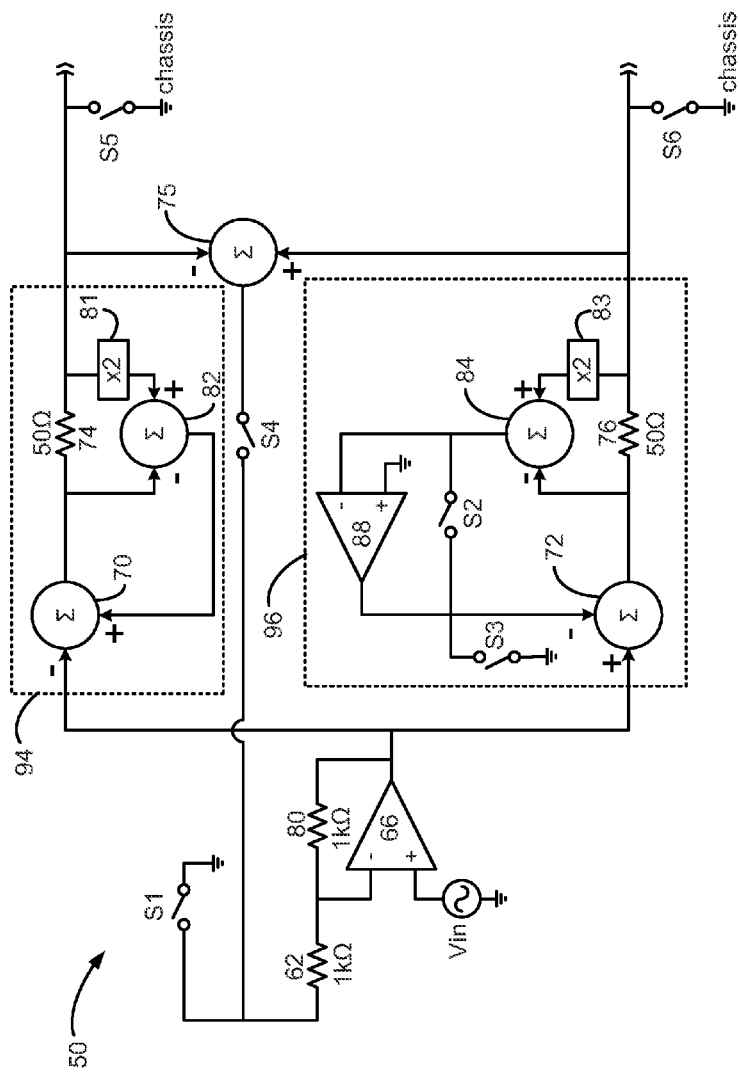
FIG. 2A shows an embodiment of the configurable audio transmitter circuitry of the invention, with FIG. 2B showing the various modes into which the transmitter circuitry can be configured, and with FIG. 2C explaining that the transmitter circuitry has a configurable input resistance from the vantage point of noise on the signal wires depending on the transmitter's mode.
Figure 2A:
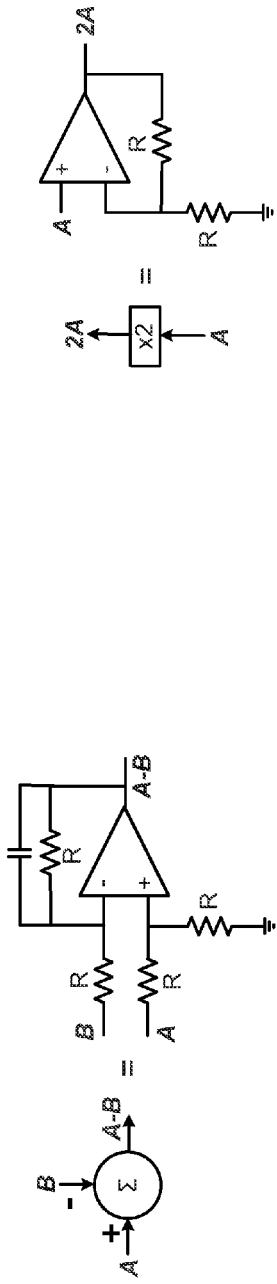

One embodiment of the improved audio transmitter circuitry 50 is shown in FIG. 2A. The transmitter 50 receives an input audio signal, Vin, from a source device. Vin may have already been processed (e.g., amplified and filtered) earlier in the transmitter 50 (not shown), which processing may be required depending on the source device connected to the transmitter 50. Generally speaking, the transmitter 50 will drive an audio signal, Vin, onto the signal wires 14 and 16 with some gain, depending on the mode in which it is operating. Because Vin is an audio signal, it would typically be comprised of frequencies within the range of human hearing, generally from 20-20000 kHz.

Transmitter 50 comprises an operational amplifier (op amp) 66 that receives Vin at its non-inverting input. The output of the op amp 66 is provided to two networks 94 and 96, which drive the signals onto signal wires 14 and 16 respectively, and which also comprise feedback loops to deal with noise, as will be explained further below. Each of the networks 94 and 96 comprise various subtractor circuits (70, 72, 75, 82 and 84), and each comprises a voltage doubler 81 and 83. Example circuits for these well-known circuit blocks are shown at the bottom of FIG. 2A. Network 96 also contains an op amp 88 configured as an inverter. Subtractors 70 and 72 in networks 94 and 96 respectively act as the drivers for the signals to be transmitted onto signal wires 14 and 16, with such signals being driven through low-value resistors 74 and 76 (e.g., 50 ohms) respectively. Thus, drivers 70 and 72 can drive audio signals onto the signal wires 14 and 16 with a low output resistance, a point that is discussed further below.

Subtractor 75, and its selectable coupling to the op amp 66 via switches S1 and S4 as discussed further below, comprises a feedback circuit with resistor 62 and 80 to op amp 66. Resistors 62 and 80 in a preferred (but not necessary) embodiment can comprises equal resistances (e.g., 1 k ohms), although this is not strictly necessary. Resistors 62 and 80 comprise a voltage divider and provide at the inverting input of op amp 66, and based on the user's selection, either a representation of a comparison of the signals on the first and second signal wires (from subtractor 75) in a differential mode, or a representation of ground in a single-ended mode, as will be shown in detail later.

Figure 1:
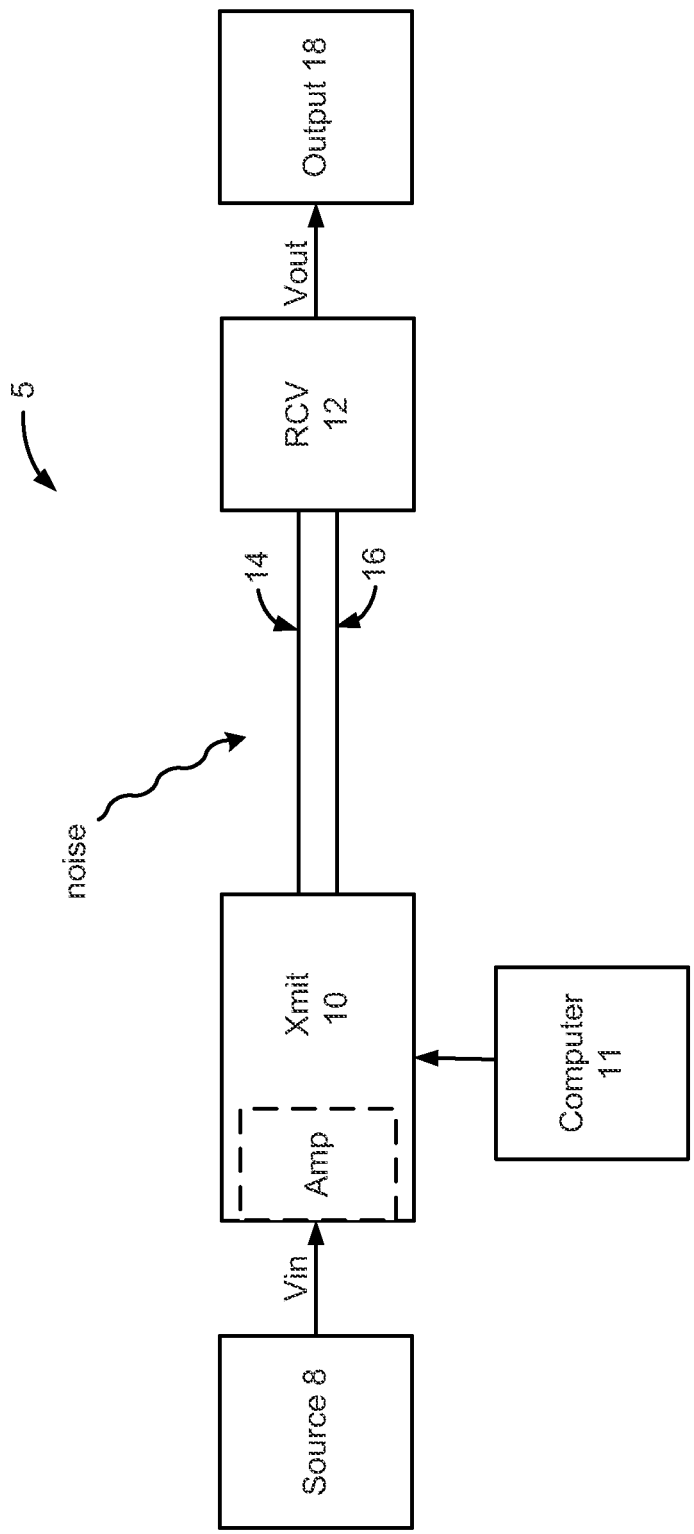
FIG. 1 shows an audio system of the prior art, including a transmitter and a receiver coupled by a pair of signal wires.

The operational mode of the transmitter 50 is dependent on the status of the various switches S1-S6, that is, whether these switches are closed or opened. FIG. 2B shows these various operational modes, and the corresponding status of the switches for each mode. The operational modes are largely defined based on the desired method of transmitting and receiving the signal, i.e., whether transmission and receipt is differential on signal wires 14 and 16, or single ended such that one of the signal wires 14 or 16 carries the signal with the other signal wire grounded. The user, via software operating in computer 11 (see FIG. 1), can control the operational mode and hence the status of the switches S1-S6. Switches S1-S6 can alternatively be manual switches, or solderable contact points.

Before discussing these various modes in detail, FIG. 2C is used to illustrate operation of the transmitter 50 at a high level, and generally shows how the transmitter is adjustable to handle noise appropriately depending on the operational mode. The top of FIG. 2C shows the circuitry and various resistances involved in driving an audio signal from the transmitter 50 to the receiver 12. As discussed earlier, the transmitter 50 has an output resistance, Ro, which is relatively low (e.g., 50 ohms) as set by resistors 74 or 76. The audio signal is driven through this output resistance Ro to the receiver 12, which has a relatively high input resistance, Ri_R, such as 10 k ohms at its receiving amplifier. The combination of a low output resistance and a high input resistance is desired when driving an audio signal, as this will allow (by virtue of the voltage divider formed by Ro and Ri_R) the majority of the voltage exiting the driver, Vx, to appear at the input to the amplifier at the receiver 12. Thus, only a small amount of the audio signal is lost in transit from the transmitter 50 to the receiver 12.

The bottom of FIG. 2C shows the coupling of noise (Vnoise) onto either or both of signal wires 14 or 16 by way of an impedance Z91, which could be magnetically or capacitively coupled. Such coupling results in an undesired voltage, Vhum, on the signal wire(s). Like the audio signal, Vhum sees the input resistance of the receiver, Ri_R. Vhum also sees an input resistance, Ri_X looking into the transmitter 50. The inventor has recognized that it is desirable for the input resistance Ri_X to be variable in the different operational modes of the transmitter 50, because such variability can be beneficial in negating the undesired effects of Vhum. For example, when transmitting a differential signal, it is desired that Ri_X be relatively high. By contrast, when driving a single ended signal, it is desired that Ri_X be relatively low. This will be discussed in further detail in the preceding figures, but for now note that FIG. 2B shows the relative values for the input resistance Ri_X in the different modes.

Figure 3A:
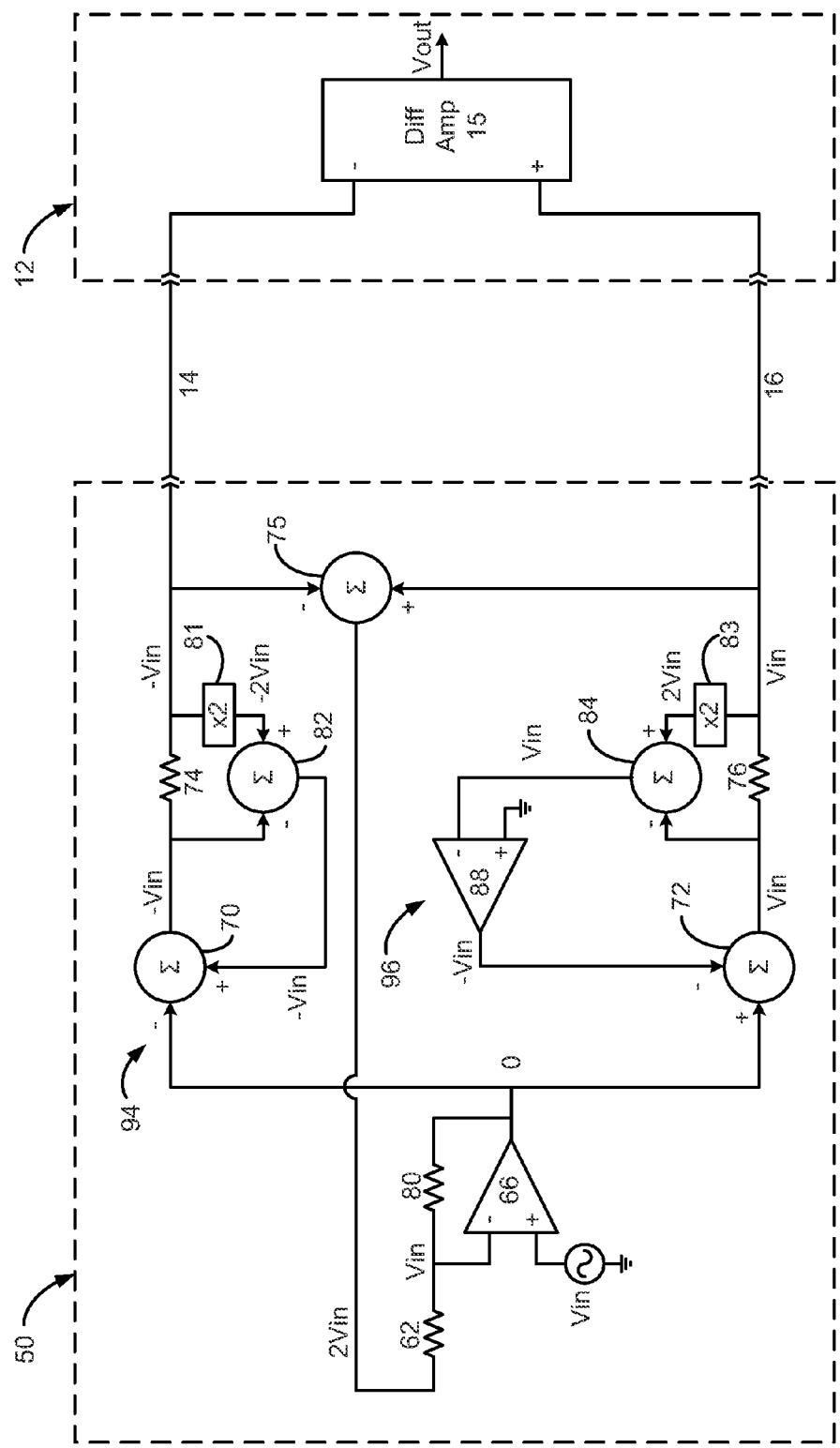
FIGS. 3A and 3B show the configuration of the transmitter of FIG. 2A in a first mode, in which transmission and reception of the audio signal is differential.
Figure 3B:
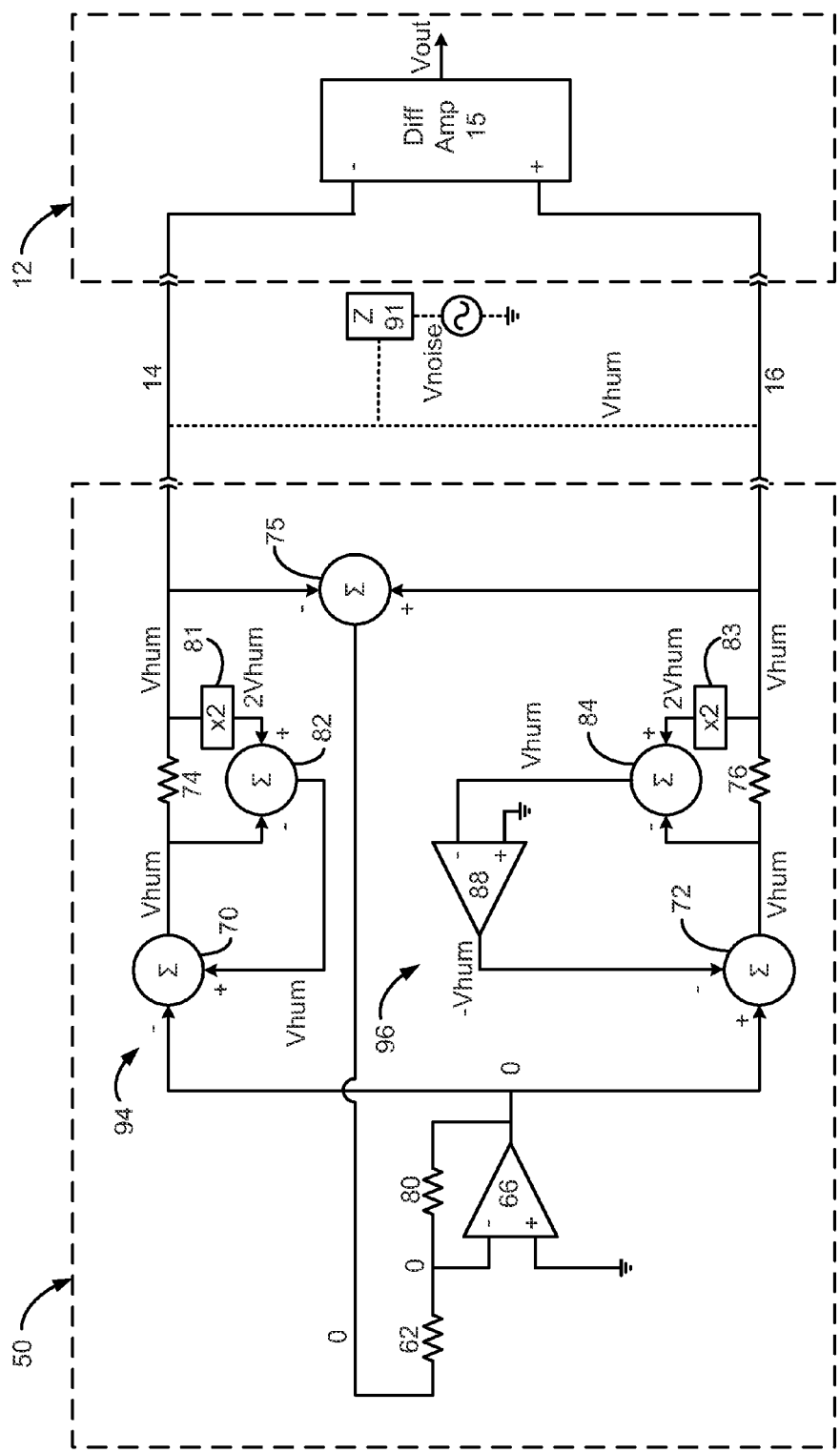

FIGS. 3A and 3B illustrate operation of the transmitter 50 when configured to operate in a differential transmit/differential receive mode: in other words, when the transmitter 50 transmits a differential signal on signal wires 14 and 16 to a receiver 12 that has a differential amplifier (diff amp) 15. When configured for this mode, switch S4 is closed to connect subtractor 75 to the op amp 66, and switch S1 is open. Switches S2 and S3 are open to allow the inverter 88 to function. Switches S5 and S6 are open, and so neither of the signal wires 14 or 16 are shorted to ground as is appropriate for differential signaling.

FIG. 3A shows the approximate voltages apparent in the transmitter 50 when configured in this mode. The transmitter 50 will respond to the relatively low frequencies in Vin as if they were DC values. As can be seen, the audio signal, Vin, is differentially replicated on signals wires 14 (−Vin) and 16 (Vin). Because the magnitudes on the signal wires 14 and 16 are opposites, they provide an effective output of 2Vin, and thus the transmitter 50 provides a non-unity gain of two. Subtractor 75 subtracts the values on signal wires 14 and 16 (2Vin), and provides it to the op amp 66. Resistors 62 and 80 at the op amp operate to divide 2Vin, such that the output of the op amp 66 is 0V.

The approximate steady state voltages that appear in each network 94 and 96 are shown. Notice that, the drivers 70 and 72 output −Vin and Vin through low output resistances 74 and 76 to produce the desired differential signal on the signal wires 14 and 16.

FIG. 3B shows how noise coupled to the signal wires (Vhum) is handled in this mode. For simplicity, the input audio signal, Vin, has been grounded at the input to op amp 66, so that only the approximate voltages produced by Vhum are illustrated at the various nodes in the circuit. One skilled in the art will understand that the voltages in FIGS. 3A and 3B can be superimposed (added) to each other to provide a complete picture of how signal (FIG. 3A) and noise (FIG. 3B) are processed by the transmitter 50.

Because neither of signal wires 14 or 16 is grounded in this differential signaling mode, Vhum would likely appear on both of the signal wires. To diminish the effect of Vhum in this mode, it is desired to present Vhum strongly to the diff amp 15 in the receiver 12, rather than have Vhum drain backwards into the transmitter 50. Diff amp 15, which computes the difference between voltages on signal wires 14 and 16, will generally be able to subtract Vhum out of this difference, so long as the transmitter 50 doesn't skew Vhum on the two signal wires 14 and 16. To prevent such skew, it is desirable that the input resistance that the noise sees looking back into the transmitter, Ri_X, be high. Referring again to FIG. 2C, as Ri_X is adjusted to a high value, Vhum's effect is more strongly felt at the receiver's amplifier. This is especially true if Ri_X is made higher, or substantially higher, than the input resistance to the receiver, Ri_R.

FIG. 3B shows how such high input impedance can be achieved in this mode. Basically, high input impedance is achieved by replicating Vhum on both sides of the output resistors 74 and 76. If Vhum is present on both sides of these resistors 74 and 76, then no current would flow, and their impedances would effectively be infinite. Replicating Vhum in this manner is affected by the networks 94 and 96, as the voltages present at the nodes in these networks illustrate.

One skilled in the art will understand that the adjusted input resistance Ri_X would not actually be infinite. First, there will be some small voltage difference across output resistors 74 and 76, i.e., Vhum may not be perfectly replicated on both sides of those resistors. Moreover, there will necessarily be finite, albeit relatively high, resistances in the other circuit blocks that meet with signal wires 14 and 16, such as subtractor 75 and doublers 81 and 83. Nonetheless, increasing the input resistance Ri_X to any higher value will tend to keep Vhum from draining back into the transmitter 50, where it could be skewed on the two signal wires 14 and 16, and thus not presented evenly to the diff amp 15. Simulations suggest that Ri_X in this mode is increased to 5000 ohms or higher.

Figure 4A:
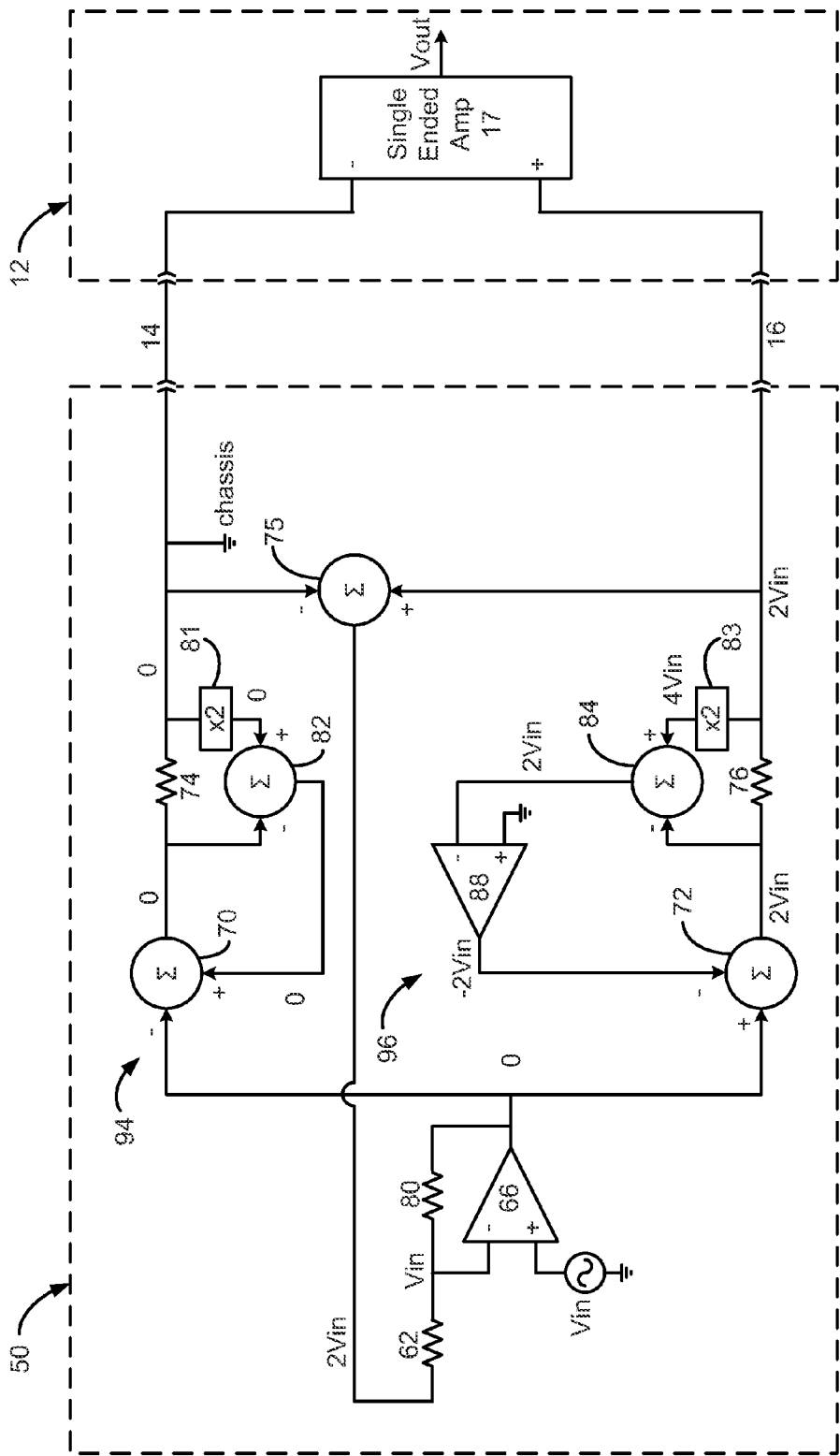
FIGS. 4A and 4B show how the configuration of the transmitter in FIGS. 3A and 3B can be used in a second mode, in which reception is single ended.
Figure 4B:
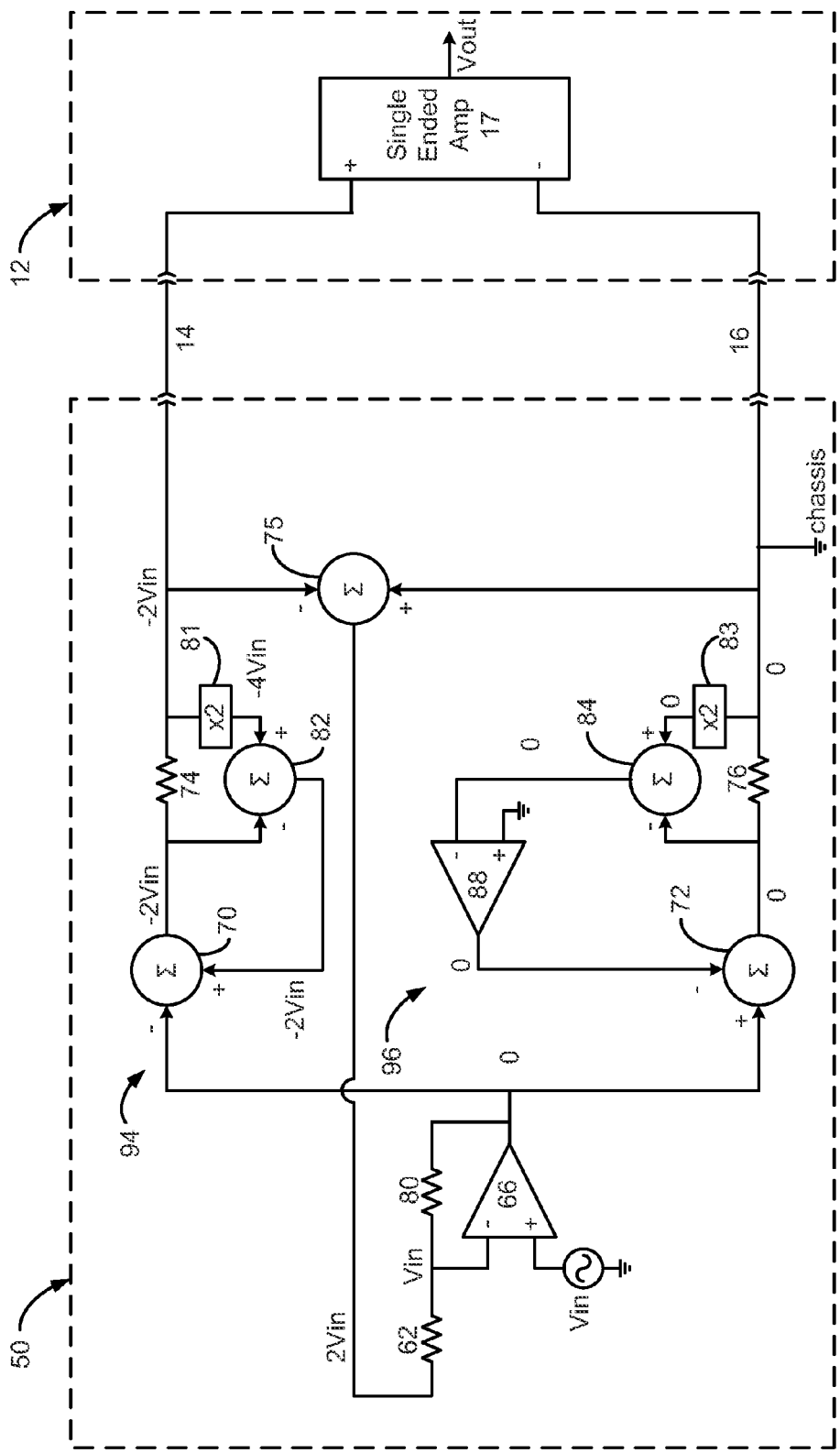

FIGS. 4A and 4B illustrate a different mode in which the transmitter 50 is generally configured for differential transmission, but where reception is single ended, i.e., where the receiver has a single ended amplifier 17. In this mode, the transmitter is generally configured for as in FIGS. 3A and 3B, but one of the switches S5 or S6 (see FIG. 2A) are closed to ground one of the signal wires 14 (FIG. 4A) or 16 (FIG. 4B) to ground. In one example, the signal wires 14 or 16 are shorted to chassis ground (i.e., to the chassis of the transmitter 50), but could also comprise circuitry ground.

FIGS. 4A and 4B shows that the transmitter 50 works in this mode, regardless of which of the signal wires 14 or 16 is grounded. If wire 14 is grounded (FIG. 4A), wire 16 will provide 2Vin, and thus the transmitter 50 provides a gain of two. If wire 16 is grounded (FIG. 4B), wire 14 will provide −2Vin, again a gain of two if polarity is ignored. While this mode works, it is not preferred, because it does not optimally handle Vhum (not shown). Instead, the next two modes comprise preferred configurations for transmitter 50 if one of the signal wires 14 or 16 is shorted to drive a single-ended receiver 12.

Figure 5A:
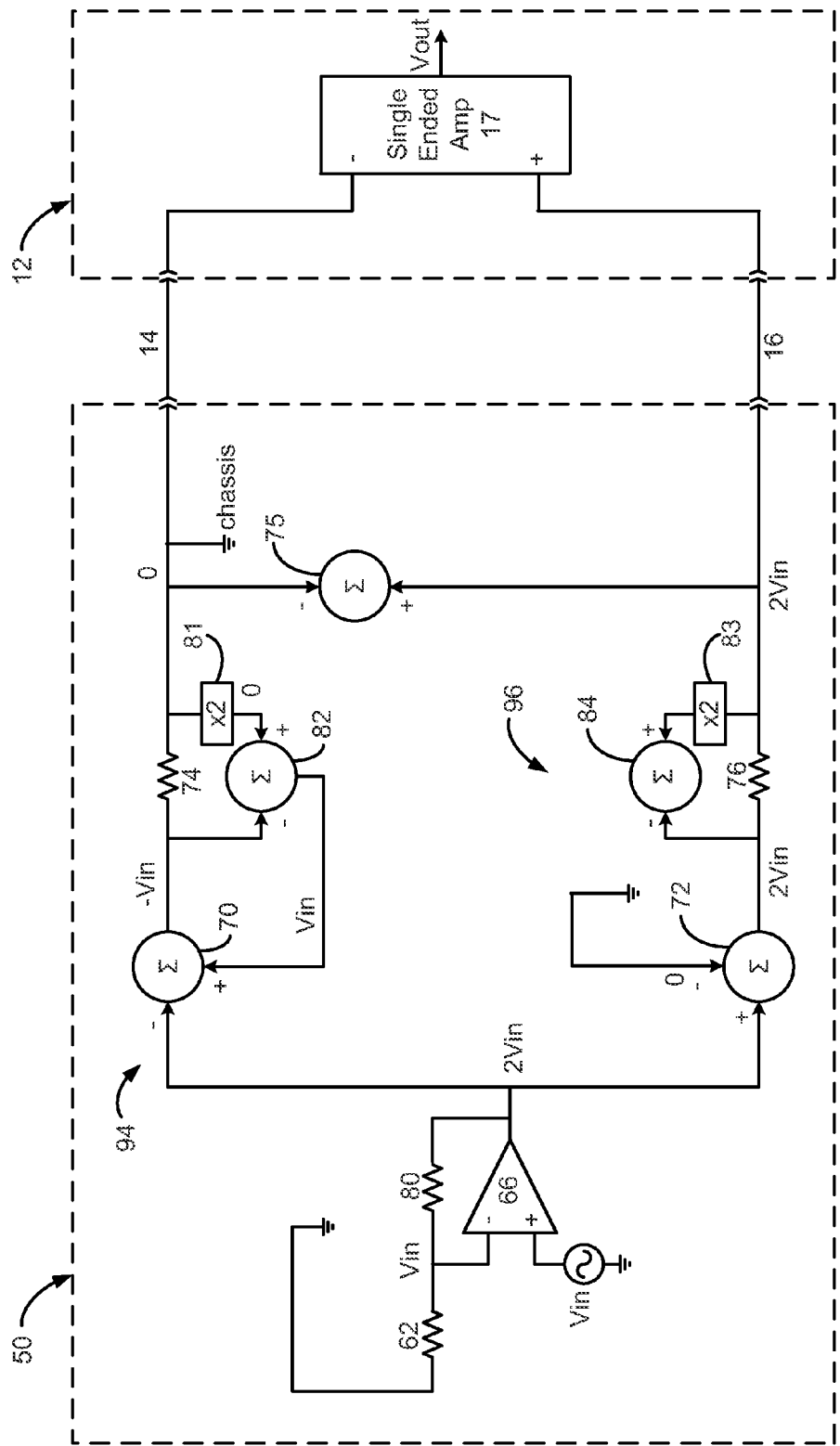
FIGS. 5A and 5B show the configuration of the transmitter of FIG. 2A in a third mode, in which transmission and reception of the audio signal is single ended.
Figure 5B:
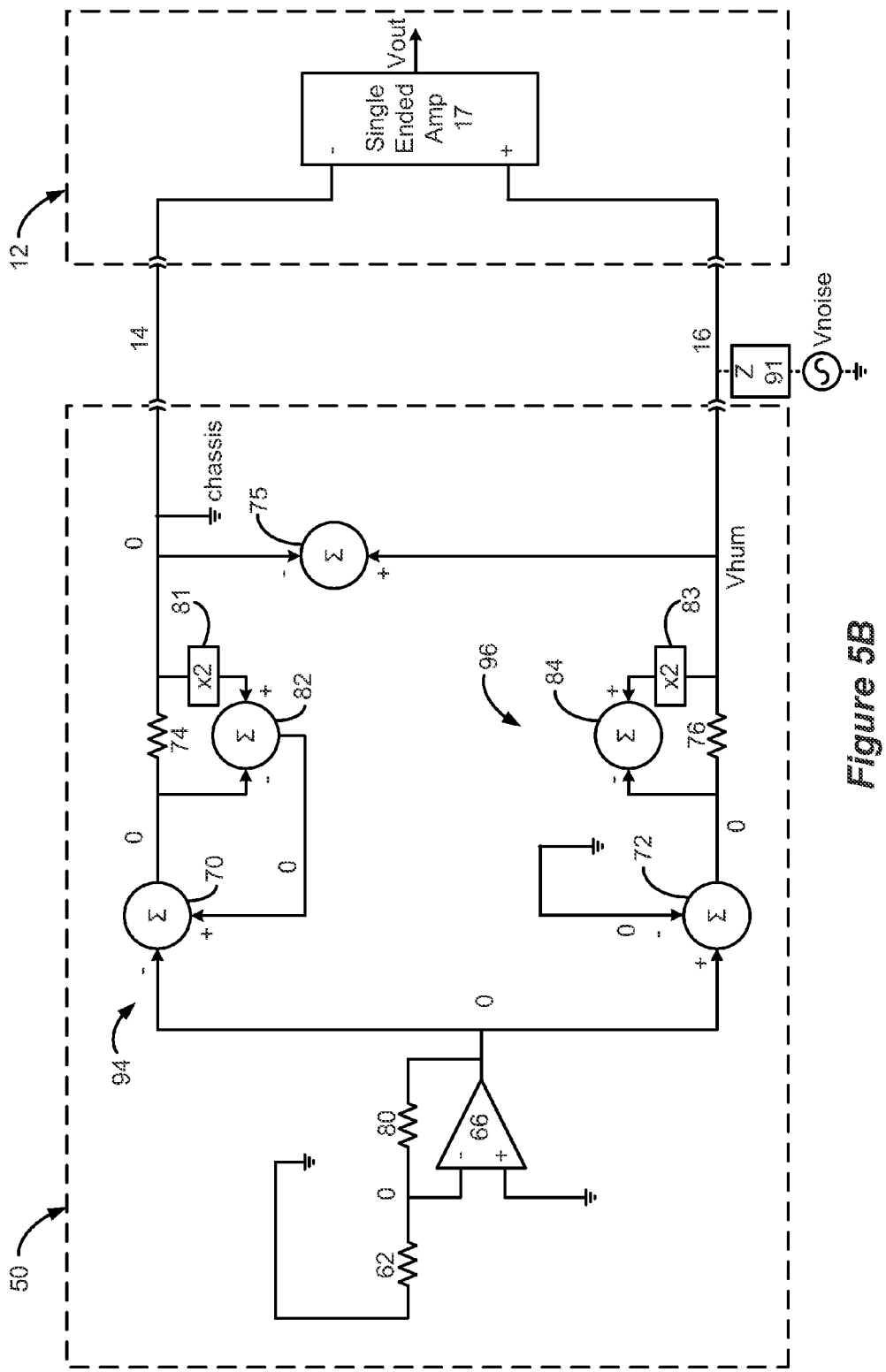

FIGS. 5A and 5B illustrate operation of the transmitter 50 when configured to operate in a first single-ended transmit/single-ended receive mode: in other words, when the transmitter 50 transmits a single-ended signal on signal wire 16 to a receiver 12 that has a single-ended amplifier (amp) 17. When configured for this mode, switch S4 is opened to decouple subtractor 75 from the op amp 66, and switch S1 is closed to couple the op amp 66 to ground. Switch S2 is opened to decouple subtractor 84, and switch S3 is closed to short the inverting input of subtractor 72 to ground. Effectively, subtractors 75 and 84, doubler 83, and inverter 88 in network 96 are removed from performing any useful function in the circuit. Switch S5 is closed to ground signal wire 14.

FIG. 5A shows the approximate voltages normally apparent in the transmitter 50 when configured in this mode. As can be seen, the audio signal, Vin, is replicated as 2Vin on signal wire 16, while signal wire 14 is grounded, and thus the transmitter 50 provides a gain of two. Op amp 66 creates 2Vin at its output. Driver 70 in network 94 produces a voltage −Vin which drains to ground through low-resistance and switch S5; essentially network 94 connected to signal wire 14 is uninteresting other than to note that the voltages in that network balance out. Driver 72 in network 96 produces 2Vin. Because resistor 76 is small, 2Vin essentially also appears on the other side of resistor 76, i.e., on signal wire 16.

FIG. 5B shows how noise coupled on signal wire 16 (Vhum) is handled in this mode. As in FIG. 3B, the input audio signal, Vin, has been grounded at the input to op amp 66, so that only the approximate voltages produced by Vhum are illustrated at the various nodes in the circuit. As noted earlier, the voltages in FIGS. 5A and 5B can be superimposed to provide a complete picture of how signal (FIG. 5A) and noise (FIG. 5B) are processed by the transmitter 50.

Because signal wire 14 is grounded in this mode, Vhum would likely appear only on signal wire 16. To diminish the effect of Vhum in this mode, it is not desired to present Vhum strongly to the single ended amp 17, as single ended amp 17 would simply amplify this noise and can't subtract it out. Instead, it is useful in this mode to have Vhum drain backwards into the transmitter 50, i.e., to be grounded at the transmitter as much as possible. To promote this, it is desirable that the input resistance the noise sees looking back into the transmitter, Ri_X, be low. Referring again to FIG. 2C, as Ri_X is adjusted to a low value, Vhum is better attenuated at the transmitter 50 and thus is not strongly felt at the receiver 12. This is especially true if Ri_X is made lower, or substantially lower, than the input resistance to the receiver, Ri_R.

FIG. 5B shows how such low input impedance can be achieved in this mode. Basically, a low input impedance is achieved by driving the output of subtractor 72 to ground (0V). Vhum on signal wire 16 would see this ground through resistor 76, which is only 50 ohms. Thus, Vhum sees a low resistance path to ground, i.e., Ri_X=50 ohms. Because this path is much lower resistance that that provided at the receiver (i.e., Ri_R), Vhum's presence is diminished at the receiver 12, and thus less likely to be fully amplified at single-ended amp 17.

Figure 6A:
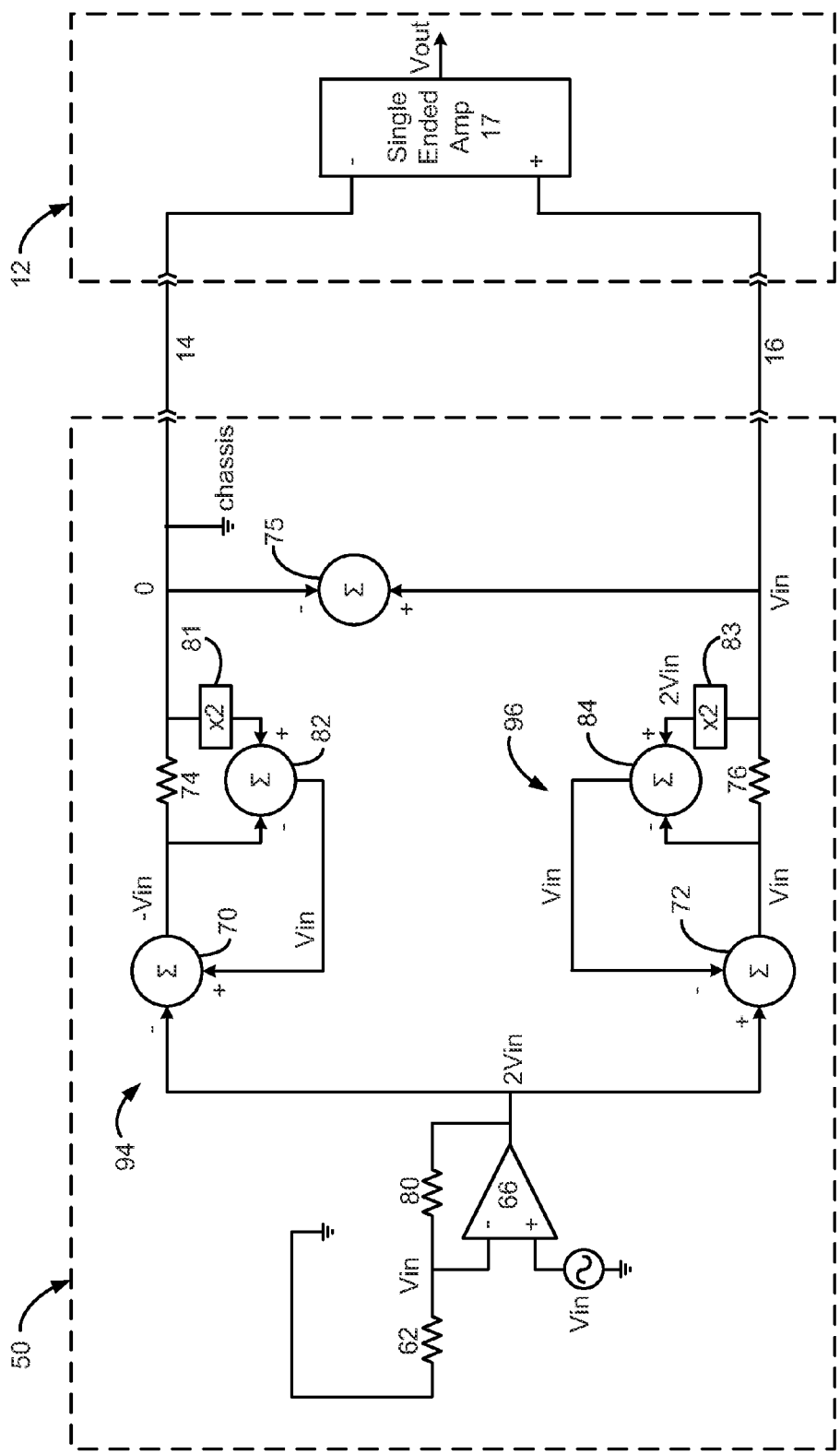
FIGS. 6A-6C show the configuration of the transmitter of FIG. 2A in a fourth mode, in which transmission and reception of the audio signal is single ended.
Figure 6B:
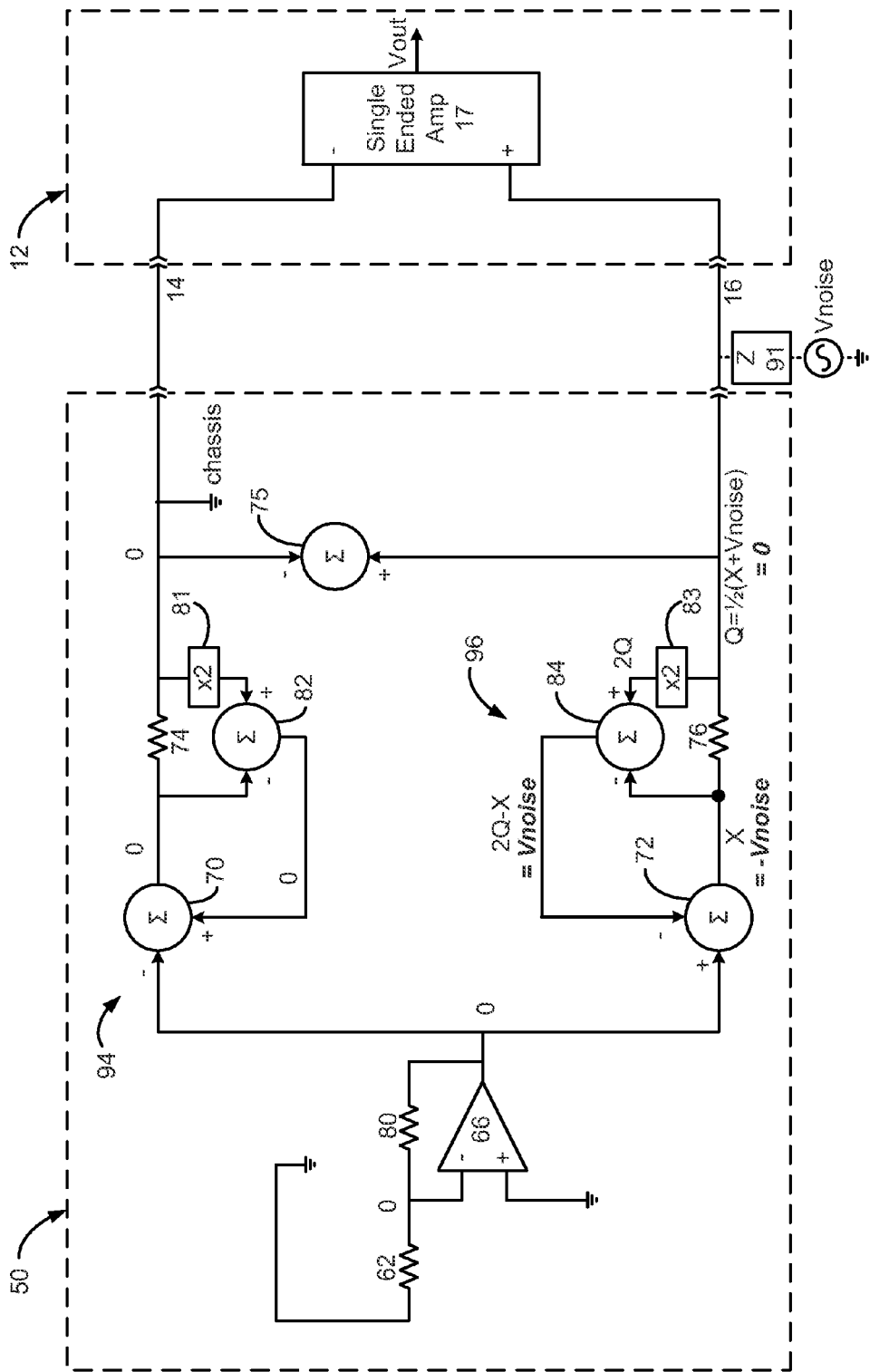

FIGS. 6A and 6B illustrate operation of the transmitter 50 when configured to operate in a second single-ended transmit/single-ended receive mode. When configured for this mode, switch S4 is opened to decouple subtractor 75 from the op amp 66, and switch S1 is closed to ground the inverting input of the op amp 66. Switch S2 is closed and switch S3 is opened, which routes the output of subtractor 84 to the inverting input of subtractor 72. Effectively, subtractor 75 and inverter 88 are removed from performing any useful function in the circuit. Switch S5 is closed to ground signal wire 14.

FIG. 6A shows the approximate voltages normally apparent in the transmitter 50 when configured in this mode. As can be seen, the audio signal, Vin, is replicated as Vin on signal wire 16, while signal wire 14 is grounded, and thus the transmitter 50 provides a unity gain of one. The grounded input to op amp 66 creates 2Vin at its output. Driver 70 in network 94 produces a voltage −Vin which drains to ground through resistor 74 and switch S5; essentially network 94 connected to signal wire 14 is uninteresting other than to note that the voltages in that network balance out. Driver 72 in network 96 produces Vin. Because resistor 76 is small, Vin essentially also appears on the other side of resistor 76, i.e., on signal wire 16.

(It is useful to note at this point that driver 72 in network 96 receive different voltages depending on the mode in which the transmitter 50 is configured. Thus, in the mode of FIG. 3A, the driver 72 receives the inverse of the output of subtractor 84; in the mode of FIG. 5A, the driver 72 receives ground (0V); in the mode of FIG. 6A, the driver receives the output of the first subtractor 84 without inversion).

FIG. 6B shows how noise is handled in this mode. As in earlier figures, the input audio signal, Vin, has been grounded at the input to op amp 66, so that only the approximate voltages produced by noise are illustrated at the various nodes in the circuit. The voltages in FIGS. 6A and 6B can be superimposed to provide a complete picture of how signal (FIG. 6A) and noise (FIG. 6B) are processed by the circuit.

Because signal wire 14 is grounded in this mode, noise would likely appear only on signal wire 16. To diminish the effect of noise in this mode, it is not desired to present such noise strongly to the single ended amp 17, as single ended amp 17 would simply amplify this noise and can't subtract it out, as was the case in FIGS. 5A and 5B. Instead, it is useful in this mode to have such noise drain backwards into the transmitter 50. To promote this, it is desirable that the effective input resistance seen by noise into the transmitter, Ri_X, be low, similar to what occurred in FIG. 5B.

FIG. 6B shows how such low input impedance can be achieved in this mode. As will be seen, the transmitter 50 in this mode seeks to virtually ground noise coupled onto the signal wire 16. It is therefore useful in this mode to understand the effect of Vnoise and impedance Z91 directly, with the voltage on the signal wire 16 initially represented as Q. As will be seen below, operation in this mode seeks to set Q=0, virtually grounding noise on the signal wire 16.

If we assume that the output of the subtractor 72 is a voltage X, and that the input impedances of subtractor 75 and single-ended amp 17 are sufficiently high and can be ignored, then the sum of the currents at signal wire 16 must equal zero. In other words, and assuming the signal wire 16 has a voltage of Q, $(Q-X)/R76+(Q-Vnoise)/Z91=0$ (Eq. 1). If we further assume that the magnitude of Z91 is equal to the resistance of R76, then $2Q=X+Vnoise$, or $Q=(X+Vnoise)/2$ (Eq. 2). After Q is doubled at doubler 83, and X is subtracted from it at subtractor 84, the output of subtractor 84 equals 2Q-X, which equals Vnoise per Equation 2. If 0 and Vnoise are presented to subtractor 72, then the output of subtractor 72, X, must equal -Vnoise. Moreover, if X=-Vnoise, then Q must equal 0 per Equation 2. Thus, through this scheme, noise is virtually grounded on signal wire 16.

While the signal wire 16 is virtually grounded, note that the inverse of the noise, -Vnoise, is replicated on the opposite side of resistor 76. This causes Vnoise to see a load that is half of the total sum of Z91 and R76 because the current through this sum is twice what would normally be measured if the voltage at X was 0. Thus, once again, Vnoise effectively sees a low resistance path to ground through resistor 76, i.e., Ri_X=50 ohms. Because this path is much lower resistance that that provided at the receiver (i.e., Ri_R), Vnoise's presence is diminished at the receiver 12, and thus less likely to be fully amplified at single-ended amp 17.

Figure 6C:
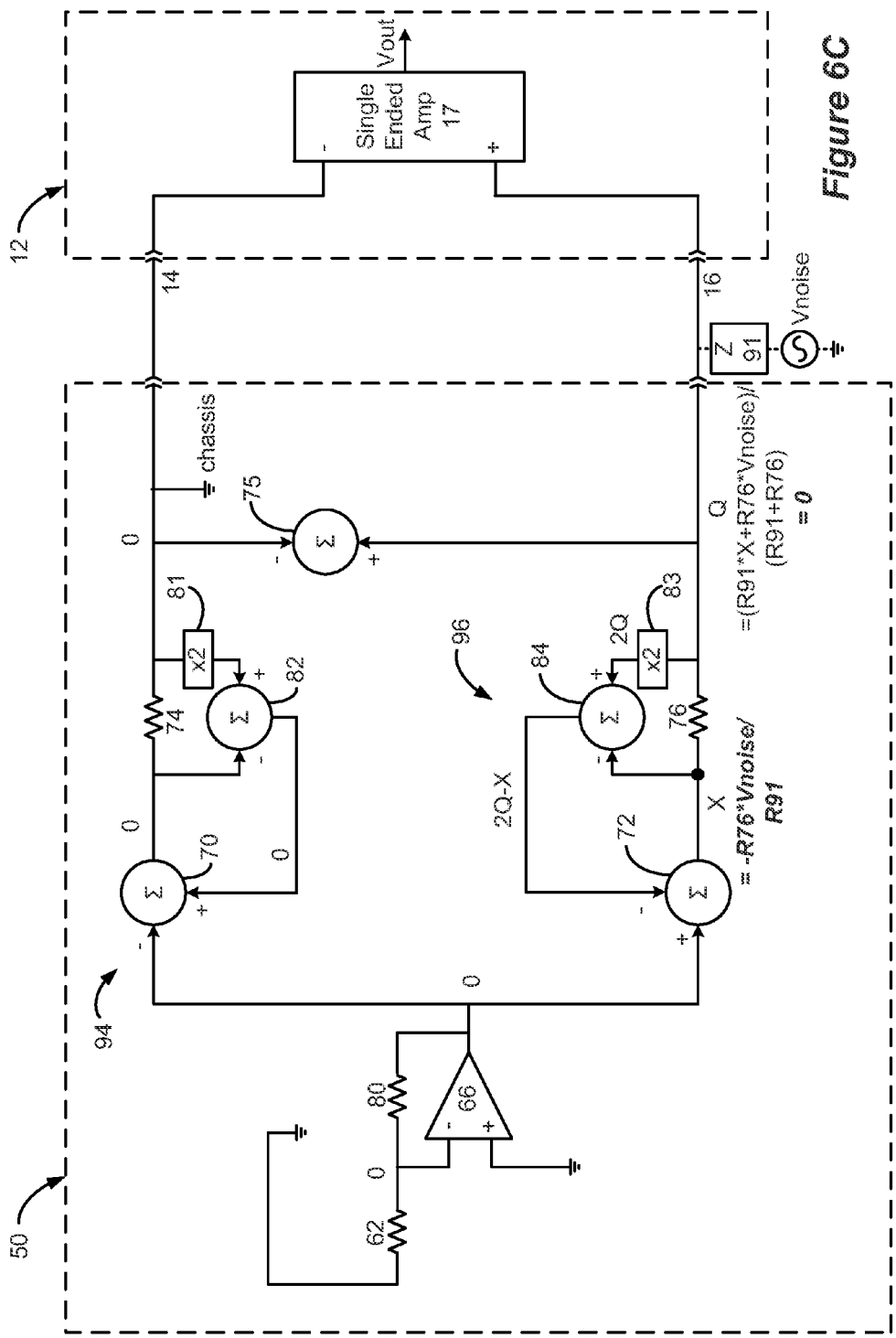

It was assumed for simplicity in the above discussion that R76 and the magnitude of Z91 were the same. However, it obviously cannot always be assumed that any magnitude of Z91 associated with Vnoise will exactly equal resistor 76. Nevertheless, even if there is some mismatch, the effects of noise are still mitigated. This is shown in FIG. 6C. Using the same variables as before, and again assuming that subtractor 75 and single-ended amp 17 can again be ignored, $(Q-X)/R76+(Q-Vnoise)/Z91=0$ (Eq. 1) can be solved for Q, which equals $(R91*X+R76*Vnoise)/(R91+R76)$, where R91 represents the resistance of Z91. The output of subtractor 84 equals 2Q-X, and the output of subtractor 72 must equal X as was assumed. Thus, $-(2Q-X)=X$, meaning that Q must equal 0. Setting Q equal to zero and solving for X yields $X=-R76Vnoise/R91$. In short, even if resistances 76 and 91 do not match, the circuit will force the voltage on the signal wire 16, Q, to 0, meaning that signal wire 16 is effectively grounded with respect to the noise. Voltage X on the other side of resistor 76, will vary according to the relative resistances, but is still a function of Vnoise, which effectively sees a low resistance path to ground through resistor 76, i.e., Ri_X=50 ohms. Again, this means that Vnoise's presence is diminished at the receiver 12, and thus is less likely to be fully amplified at single-ended amp 17.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. Thus, the present invention is intended to cover alternatives, modifications, and equivalents that may fall within the spirit and scope of the present invention as defined by the claims.

What is claimed is:

1. A transmitter for outputting an audio signal to a pair of first and second signal wires, comprising:
   an amplifier configured to receive an input audio signal; and
   first and second analog amplifier networks configured to receive an output of the amplifier, wherein the first analog amplifier network drives a first signal onto the first signal wire, and wherein the second analog amplifier network drives a second signal onto the second signal wire, each of the analog amplifier networks comprising at least one subtractor and at least one voltage doubler;
   wherein the first and second analog amplifier networks are configured to provide a first input resistance from the first and second signal wires in a differential mode in which the first and second signals comprise a differential version of the input audio signal, and to provide a second input resistance from an active first signal wire in a single-ended mode in which the first signal comprises a version of the input audio signal, wherein the second input resistance provided in the single ended mode is lower than the first input resistance provided in the differential mode.

2. The transmitter of claim 1, wherein in the single-ended mode the second signal is grounded.

3. The transmitter of claim 1, further comprising a plurality of switches, wherein the plurality of switches are configured to be selectable by a user to enter the differential or single-ended modes.

4. The transmitter of claim 1, wherein the transmitter is configured to provide a third input resistance from the active first signal wire in an alternative single-ended mode, wherein the third input resistance is lower than the first input resistance.

5. The transmitter of claim 4, wherein the first network is configured to be selectable by a user to enter the second or third modes.

6. The transmitter of claim 4, wherein the transmitter operated in the single-ended mode imparts a non-unity gain to the first signal, and wherein the transmitter operated in the alternative single-ended mode imparts a unity gain to the first signal.

7. The transmitter of claim 4, further comprising a feedback circuit, wherein the feedback circuit is selectable to provide either a function of a comparison of the first and second signals to the amplifier in the differential mode, or a representation of ground to the amplifier in the single-ended mode.

8. A transmitter for outputting an audio signal to a pair of first and second signal wires, comprising:
an amplifier configured to receive an input audio signal; and
first and second analog amplifier networks configured to receive an output of the amplifier, wherein the first analog amplifier network drives a first signal onto the first signal wire, and wherein the second analog amplifier network drives a second signal onto the second signal wire, each of the analog amplifier networks comprising at least one subtractor and at least one voltage doubler;
wherein the first and second analog amplifier networks are configured to drive either a differential version of the input audio signal on the first and second signal wires in a first mode, or a first single-ended version of the input audio signal on the first signal wire in a second mode.

9. The transmitter of claim 8, wherein in the single-ended mode the second signal is grounded.

10. The transmitter of claim 8, further comprising a plurality of switches, wherein the plurality of switches are configured to be selectable by a user to enter the first or second modes.

11. The transmitter of claim 8, wherein the transmitter is additionally configured to drive a second signal-ended version of the input audio signal on the first signal wire in a third mode.

12. The transmitter of claim 11, wherein the first network is configured to be selectable by a user to enter the second or third modes.

13. The transmitter of claim 12, wherein the second mode imparts a non-unity gain to the first signal, and wherein the third mode imparts a unity gain to the first signal.

14. The transmitter of claim 12, further comprising a feedback circuit, wherein the feedback circuit is selectable to provide either a function of a comparison of the first and second signals to the amplifier in the first mode, or a representation of ground to the amplifier in the second mode.

15. The transmitter of claim 8, wherein the first and second analog amplifier networks are configured to provide a first input resistance from the first and second signal wires in the first mode, and to provide a second input resistance from the first signal wire in the second mode.

16. The transmitter of claim 15, wherein the second input resistance is lower than the first input resistance.

17. A transmitter for outputting an audio signal to a pair of first and second signal wires, comprising:
an amplifier configured to receive an input audio signal at a first input;
a voltage divider configured to receive a first voltage at a first end, wherein the voltage divider provides a voltage-divided version of the first voltage to a second input of the amplifier; and
first and second analog amplifier networks configured to receive an output of the amplifier, wherein the first analog amplifier network drives a first signal onto the first signal wire, and wherein the second network drives a second signal onto the second signal wire, each of the analog amplifier networks comprising at least one subtractor circuit;
wherein the first and second analog amplifier networks are configurable to drive either a differential version of the input audio signal on the first and second signal wires in a first mode, or a first single-ended version of the input audio signal on the first signal wire in a second mode; and
wherein the first voltage is selectable to comprise either a comparison of the first and second signals in a first mode, or ground in a second mode.

18. The transmitter of claim 17, wherein a second end of the voltage divider is provided to the output of the amplifier.

19. The transmitter of claim 17, wherein the first analog amplifier network further comprises a first resistor, wherein a first subtractor of the first analog amplifier network is configured to provide from its output the first signal onto the first signal wire through the first resistor, wherein the second analog amplifier network comprises a second resistor, wherein a second subtractor of the second analog amplifier network is configured to provide from its output the second signal onto the second signal wire through the second resistor.

20. The transmitter of claim 17, wherein the first analog amplifier network further comprises a first doubler for doubling the first signal, and wherein the second analog amplifier network further comprises a second doubler for doubling the second signal.

21. The transmitter of claim 20, wherein the first analog amplifier network comprises a third subtractor for subtracting the output of the first subtractor from the doubled first signal, and wherein the second analog amplifier network comprises a fourth subtractor for subtracting the output of the second driver from the doubled second signal.

22. The transmitter of claim 21, wherein the output of the fourth subtractor is provided to the second subtractor.

23. The transmitter of claim 22, wherein the second subtractor subtracts the output of the amplifier from the output of the fourth subtractor to produce its output.

24. The transmitter of claim 21, wherein first subtractor is configured to selectively receive either the inverse of the output of the third subtractor in the first mode, or ground in the second mode.

25. The transmitter of claim 24, wherein the first subtractor is configured to selectively receive either the inverse of the output of the third subtractor in the first mode, or ground in the second mode, or the output of the third subtractor in a third mode.

26. The transmitter of claim 24, wherein the first subtractor subtracts the received signal from the output of the amplifier to produce its output.

27. The transmitter of claim 17 further comprising a fifth subtractor for providing the comparison of the first and second signals in the first mode.

* * * * *